United States Patent [19]

Stambaugh

[11] Patent Number: 4,485,460
[45] Date of Patent: Nov. 27, 1984

[54] ROM COUPLING REDUCTION CIRCUITRY

[75] Inventor: Mark A. Stambaugh, Houston, Tex.

[73] Assignee: Texas Instruments Incorporated, Dallas, Tex.

[21] Appl. No.: 376,318

[22] Filed: May 10, 1982

[51] Int. Cl.³ .............................................. G11C 11/40
[52] U.S. Cl. .................................... 365/203; 365/104
[58] Field of Search ........................ 365/104, 174, 203

[56] References Cited
U.S. PATENT DOCUMENTS 4,318,014 3/1982 McAllister et al. ................ 365/203

Primary Examiner—Terrell W. Fears
Attorney, Agent, or Firm—Thomas E. Tyson; Leo N. Heiting; Melvin Sharp

[57] ABSTRACT

A read-only memory includes an array of rows and columns of memory cells with row lines and column lines associated with the array. The row lines are partitioned into groups that provide bits of a word on a number of output lines. Each group consists of an output line and a first voltage line with a plurality of row lines in between. A row selector is provided that receives an address signal for selecting a particular row in each group and connects a row line on one side of the selected row to the first voltage line and connects the row line on the other side of the row to the output line. A row precharge circuit is provided for precharging the row lines prior to the connection of a row line to an output line. Also provided is a column select circuit for receiving an address signal for connecting a particular column line to a second voltage line and for connecting one or more of the remaining column lines to one of the first voltage lines in order to reduce coupling.

4 Claims, 2 Drawing Figures

ROM COUPLING REDUCTION CIRCUITRY

BACKGROUND OF THE INVENTION

1. Field of the Invention

This invention relates to read-only memory devices in general, and more particularly, to metal oxide silicon read-only memories.

2. Description of the Prior Art

The earliest semiconductor memories used diode matrices. The presence or absence of a diode indicated data in each of the memory cell locations. These diode memories were referred to as read-only memories since these matrices could not store additional information without being physically altered.

Later read-only memories were fabricated with metal oxide silicon field effect transistors in arrays. The actual information was programmed into the array by actually fabricating the gates of the transistors. Therefore when the memory was read, if a gate was present for the addressed location, a voltage output would result. If no gate had been fabricated, no voltage output would result. One such read-only memory is described in U.S. Pat. No. 3,934,233 entitled, "Read-Only Memory for Electronic Calculator", by Roger J. Fisher and Gerald D. Rodgers and assigned to Texas Instruments. This type of read-only memory (ROM) includes a virtual ground architecture with a precharge system to conserve power. In a precharge system, the precharge metal lines which act as gates to the memory transistor devices become floating in curret architectures during the read cycle. These floating metal lines can be coupled to nondischarging diffusions as other diffusions underneath them. These diffusions partially discharge when they should have remained precharged. This erroneous discharge can result in incorrect data being read from the ROM. To decrease the effect of coupling, designers usually precharge several of the diffusions to the supply voltage. Ideally, the diffusions of the ROM can only be precharged to a value just below the flip point of the sense amplifier that is connected to the output line of the ROM device. By increasing the amount of voltage necessary to flip the sense amplifier, the integrity of the data is maintained. However, the increased voltage swing requires a longer time to discharge. Because of that fact, ROMs contained in present integrated circuits limit the speed at which these integrated circuits may operate. Secondly, since the diffusions are precharged to a higher voltage level, the charge coupled into metal lines may be injected into the substrate resulting in the forward-biasing of the diffusions that are attached to those metal lines. This injection charge may be collected by neighboring precharged diffusions causing an erroneous discharge.

It is an object of the invention to reduce the coupling between the floating metal gate lines and the diffusions in the substrate.

SUMMARY OF THE INVENTION

In accordance with the present invention, a read-only memory is provided that includes an array of rows and columns of memory cells together with row lines and column lines associated with the array. The row lines are partitioned into groups to provide bits of a word on output lines where each group consists of an output line and a first voltage line with a plurality of intermediate row lines between the output line and the first voltage line. A row select circuit is provided that receives an address signal for selecting a particular row in each group and connecting the row line of one side of the selected row to the first voltage line for that group and connecting the row line on the other side of the selected row to an output line for that group. Further provided is row precharge circuits for precharging the row lines prior to the connection of a row line to an output line. Also provided is a column select circuit for receiving an address signal for connecting a particular column line to a second voltage line and for connecting one or more of the remaining column lines to one of the first voltage lines.

BRIEF DESCRIPTION OF THE DRAWING

The novel features believed characteristic of the invention are set forth in the appended claims. The invention itself, however, as well as other features and advantages thereof will be best understood by reference to the detailed description which follows when read in conjunction with the accompanying drawing wherein:

DESCRIPTION OF THE INVENTION

Instead of reducing the effects of coupling as certain memory designs try to do, this invention attacks the cause of the problem, i.e., the coupling of the floating metal gate lines. These metal lines are not coupled if they are driven by active devices. This invention provides the driving of a selected number of the floating metal lines with a minimal increase in circuitry.

To drive all the metal lines with the exception of the selected line, a large amount of decode circuitry is required which, in turn, requires a large amount of circuit area on the semiconductor device. The effects of coupling can be limited to an acceptable amount by driving only one-half of the metal lines during the discharge time of the memory. This reduces the amount of coupling capacitance by approximately 50 percent and increases the fixed capacitance on the diffusions significantly. The cumulative affect of both the changes causes an approximated 50 percent reduction in coupling. This technique results in a faster discharge with greater data reliability.

Figure 1A:
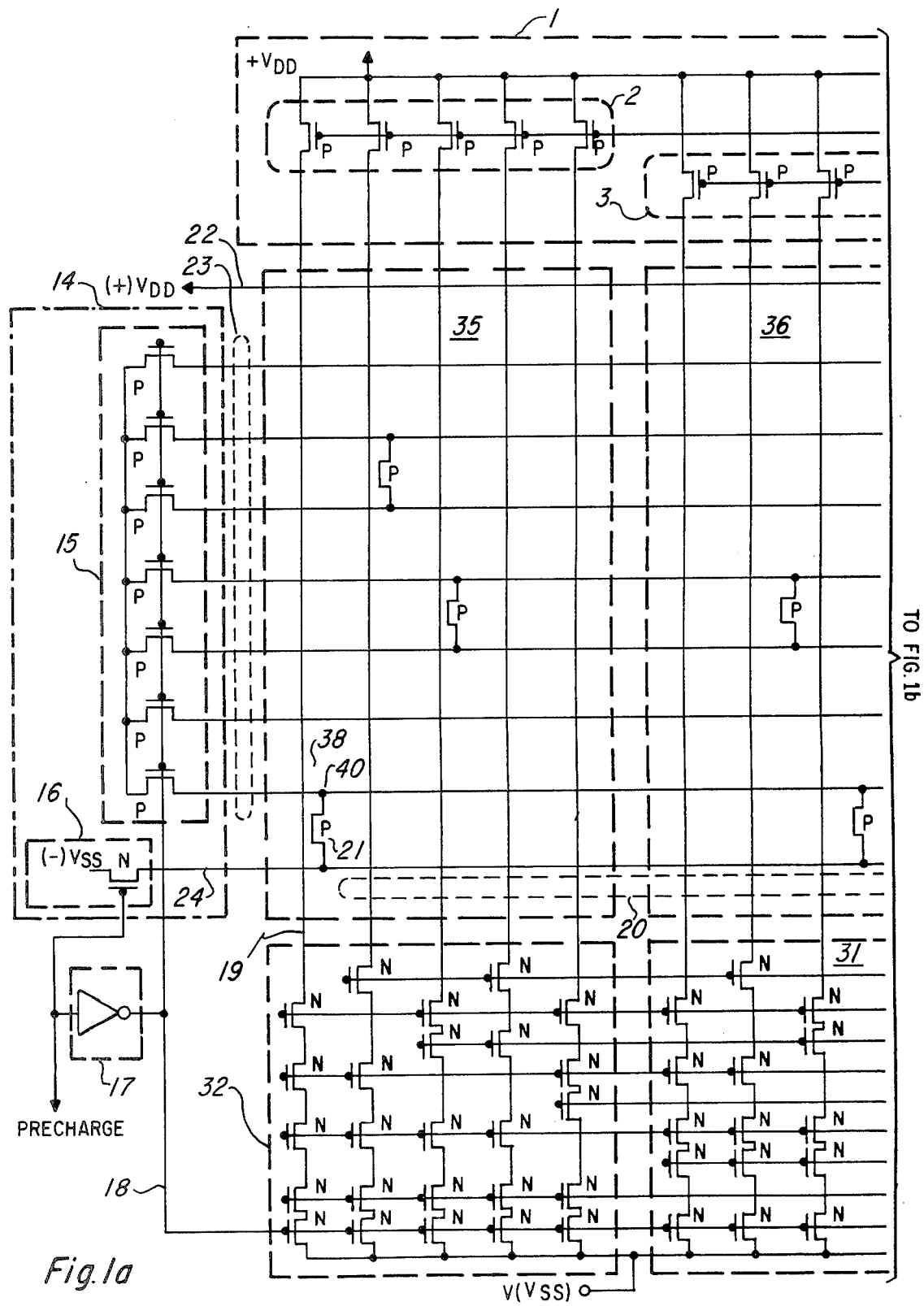
FIGS. 1a and 1b are an electrical schematic of a read-only memory.
Figure 1B:
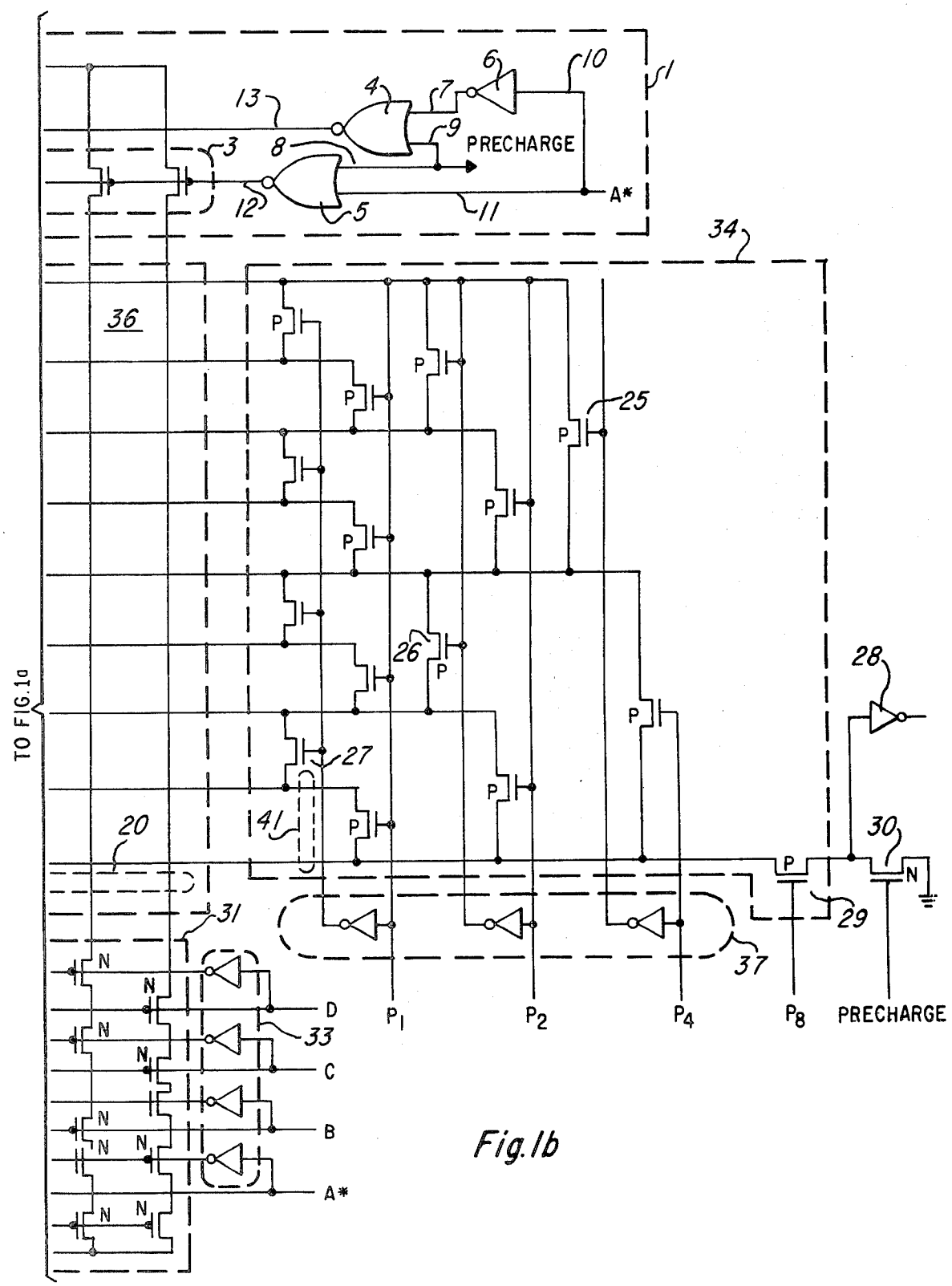

FIGS. 1a and 1b illustrate a memory architecture. The actual memory array is shown as matrices 35 and 36 containing transistor elements, such as 21 or no transistors elements such as 38. The matrices 35 and 36 are comprised of several row lines 23 and 24 and several column lines, 19 and 20. The row lines 23 and 24 are connected to a precharge circuit 14 and a row decoding circuit 34. Columns 19 and 20 are connected to column decoding circuits 32 and 31 and to circuit 1. Circuit 1 illustrates the present invention.

The transistors in the matrices 35 and 36 contain a P indicating P channel devices. The transistors in column decoding circuits 31 and 32 contain an N indicating N channel devices. The two power lines for the memory circuit illustrated are Vdd which is a positive voltage and Vss which is a negative ground voltage. P channel devices are turned on when the gate of the P channel device receives a voltage of Vss which is the equivalent of a logic "0". Likewise N channel devices are turned on when their gates receive a voltage of Vdd which is equivalent to a logic "1".

Matrices 35 and 36 contain two voltage lines. The first voltage line (or rail) 22 is connected Vdd. The second voltage line 24 is connected to Vss via device 16 on one side and through devices 29 and 30 on the opposite side. During precharge, i.e., when precharge equals 1, device 16 and device 30 are turned on to precharge line 24 to Vss. After precharge i.e., when precharge equals 0, device 16 and 30 isolate line 24 from Vss. After precharge the selected element in matrices 35 and 36 discharges line 24 is element gate is present to provide an output through the sense amplifier 28. If no device is present in the selected row and column within matrices 35 and 36, there is no output from sense amplifier 28.

During precharge row lines 23 and 24 are precharged to Vss. Line 24 is precharged to Vss via device 16 and 30. Row lines 23 are precharged by devices 15 which are P channel devices and receive an inverted precharged signal through inverter 17. Devices 15 and 16 comprise the row precharge circuitry 14. After precharge, one of the devices or spaces in matrices 35 and 36 is selected by the row decoding circuit 34 and column decoding circuits 31 and 32. The row lines 23 and 24 are diffusions in a semiconductor substrate. Since Row lines 23 are precharged by P channel devices, these lines 23 are actually precharged to a higher voltage than Vss. As a result, the majority of the current flowing through the selected device is used to discharge the single line 24 that is precharged all the way to Vss. This results in a faster discharge time because the charge transfer necessary to flip the sense amplifier 28 is smaller.

The column lines 19 and 20 are metal lines across the diffusions. The column lines are addressed by column decoding circuits 31 and 32 containing several N channel transistors that are connected to address lines A, B, C and D. The address lines provide true signals to N channel devices to column decode circuits 31 and 32 and complement signals through inverters 33 to N channel devices in the column decode circuits 31 and 32. After precharge, line 18 goes high thus activating the lower row of N channel devices in column decoding circuits 31 and 32. The remaining addresses A, B, C and D, select one of the columns, lines 19 and 20. During precharge, circuit 1 precharges all of the column lines 19 and 20. After precharge, the selected column line is allowed to discharge through the column decode circuits 31 and 32 to Vss. This discharge causes the selected device, if present, in the selected row to discharge line 24, causing a signal to output from sense amplifier 28. If no device is present in the selected row and column, there is no output on sense amplifier 28. In addition to precharging the column lines 19 and 20, circuit 1 also provides that a portion of the nonselected column lines be connected to Vdd, thus causing only a small number of column lines to float. This reduction in the number of floating column lines reduces the coupling in the memory device.

Circuit 1 contains two NOR gates 4 and 5 and an inverter 6 connected to a set of P channel devices 2 and 3. The NOR gates 4 and 5 receive two inputs: precharge and the address "A". The address "A" is inputted into NOR gate 4 via line 10 through inverter 6 onto line 7. NOR gate 4 also receives the precharge input on line 9. NOR gate 5 receives the precharge input on line 8 and receives the address "A" input on line 11. NOR gate 4 is outputted on line 13 to the P channel devices 2. NOR gate 5 outputs on line 12 to P channel devices 3. When precharge is logical 1, the output of both NOR gates 4 and 5 is a logical 0 which activates the P channel devices 2 and 3 to precharge the column lines 19 and 20 to Vdd. A Vdd on the column lines turns off the P channel devices contained in the memory matrices 35 and 36. However, after precharge a logical 0 is outputted from either NOR gate 4 or 5 to the set of nonselected column lines, resulting in that set of column lines being tied to Vdd during the discharge cycle. The other set of column lines is isolated from Vdd since the output of the other NOR gate is a 1, turning off the P channel devices.

The operation of this circuitry can best be understood by an example. If an address of 1111 (i.e., a=1, b=1, C=1 and d=1) is inputted to the column decode circuits 31 and 32 and into the row decode circuitry 34 of 1110 (i.e., P1=1, P2=1, P4=1, P8=0) the following occurs. During precharge row lines 23 and 24 are precharged to Vss as discussed and column lines 19 and 20 are precharged to Vdd. After precharge, line 24 is isolated from Vss by device 16 and device 30. Since P8=0, device 29 is on, allowing the matrix to output to sense amplifier 28. Since P4=1, a "0" results at the gate of device 25 in row decode circuit 34 turning on device 25. Likewise a "1" at P2 will turn on device 26 and a "1" at P1 will turn on device 27 causing the Vdd lines 22 to be shorted to node 40 of device 21. Since A=1, the input to NOR gate 4 in circuit 1 is a "0" on line 7 and a 0 on line 9 since precharge has occurred, causing the output of NOR gate 4 to be a 1 on line 13 turning off P channel device 2. A "1" on line 11 and a "0" on line 8 will cause the output of NOR gate 5 to be a "0" on line 12, thus turning on the P channel device 3 tying the column lines connected to the P channel device 3 to Vdd. The 111 address to the column decode circuits 31 and 32 selects line 19. The address to the row decoding circuit has selected row 41 as previously explained. Therefore the selected element in the memory matrices 35 and 36 is device 21. Since device 21 is present and since line 19 is allowed to discharge to Vss, there will be a 0 on the gate of the P channel device 21 causing the P channel device to turn on and discharge Vdd at node 40 to line 24 causing a signal output on sense amplifier 28. If device 21 was not present, the voltage at node 40 would not discharge to line 24 and therefore there would be no signal through sense amplifier 28.

Since one-half of the column lines are connected to Vdd during the discharge, the coupling of the remaining column lines is reduced. In a further embodiment of this invention, the P channel devices 2 and 3 may be interleaved such that a floating column will be physically placed between a column that is tied to Vdd thus further reducing the effects of coupling across the matrices 35 and 36.

In an additional embodiment of this invention, several column addresses may be inputted to circuit 1 to select a larger group of column lines to be connected to Vdd. For example, one more column address bit input to circuit 1 will reduce the floating lines to 25% of the total column lines.

Therefore the possibility of incorrect data being read from the memory device due to coupling is reduced significantly. The number of diffusion lines required to be precharged all the way to the supply voltage is reduced. This results in a considerable increase in frequency for that ROM and therefore the integrated circuit may operate at a faster clock rate. Further the possibility of incorrect data caused by injection into neighboring circuits is reduced. All these advantages are accomplished with only a small extra area required to implement the circuit shown as circuit 1.

It should also be obvious to one skilled in the art that this invention is equally applicable to a ROM that is fabricated totally with N channel devices. The structure in FIG. 1 when fabricated totally in N channel devices requires that the Vdd and Vss voltage sources be interchanged. Specifically the precharge circuit for the column lines 19 and 20 contained in circuit 1 precharges to Vss instead of Vdd. The row line precharge circuit 14 is precharged to Vdd. The precharge circuit for row lines 23 is N channel devices connected to Vdd. Device 16 is an N channel device connected to Vdd but requires bootstrapping. Bootstrapping is a technique for insulated gate field effect transistors that adds charge to the gate such that when the gate is turned on, the voltage level at the gate is a higher level than it normally would be with just the signal alone. Bootstrapping is accomplished by adding a capacitor to the gate of the device with the other side of the capacitor being coupled to an external signal. This capacitive coupling supplements the charge present at the gate to bring the gate region to a greater voltage than is normally be possible. Device 30 would also requires bootstrapping and be connected to Vdd instead of ground as shown in FIG. 1. Inverter 17 is then no longer required; however the line that is connected to the device 16 is then connected directly to line 18 which provides the signal to the bottom row of N channel devices in column decoding circuit 31. Signal 18 has to be bootstrapped in the same manner as the gate for device 16. Likewise the address lines A, B, C, and D input to the column decoder and P1, P2, P4 and P8 for the row decoder is also bootstrapped. Of course, all P channel devices contained in FIG. 1 are replaced with N channel devices. In operation the group containing the one selected column line is allowed to float, i.e., with the exception of course of the selected column line which is tied to Vdd). The group of nonselected column lines is tied to Vss to prevent the coupling problems previously discussed.

What is claimed is:

1. A read only memory comprising:
   an array of rows and columns of memory cells formed with row lines and column lines associated with the array, the column lines being partitioned in a first and second addressable group, each group consisting of a plurality of column lines;
   row select means for receiving an address signal to select a particular row and to connect the row line on one side of the selected row to a first voltage line and to connect the row line on the other side of the selected row to an output line;
   column select means for receiving an address signal to connect an addressed column line to the first voltage line of an addressed group and to connect one or more of the remaining column lines of the main addressed group to a second voltage line; and
   precharge means for precharging the row lines and the column lines prior to the connection of a row line to an output line.

2. A memory according to claim 1 being constructed of insulated gate field effect transistors, said column lines being metal or doped polysilicon strips, said row lines being elongated semiconductor regions in a face of a semiconductor means; said column select means including a plurality of metal or doped polysilicon strips connected to a plurality of address lines and a plurality of underlying elongated semiconductor regions.

3. A memory device according to claim 2, wherein said memory array includes a plurality of potential P channel field effect transistors.

4. A semiconductor read-only memory comprising an array of potential insulated gate field effect transistors in an array of rows and columns on the face of a semiconductor chip, each column being defined by a conductive strip, rows being defined by row lines in the form of elongated regions in the face of the semiconductor chip, the rows being partitioned into a plurality of groups with each group having an output line and a one first voltage line along with a plurality of intermediate row lines, a row select decoder for receiving an address which selects one row in each group and connects the intermediate row line on one side of the selected row to the first voltage line in each group and connects the intermediate row line on the other side of a selected row to the output line in each group, in a column select means having columns corresponding to the column lines for receiving an address which energizes one of the column lines and connects one or more of the remaining column lines to one of the first voltage lines.

* * * * *